United States Patent [19]
Küller

[11] 3,968,353
[45] July 6, 1976

[54] APPARATUS FOR DETERMINING THE PHASE DIFFERENCE BETWEEN THE ROLLING OSCILLATION OF A SHIP AND A LIQUID CONTAINED IN A STABILIZING TANK

[75] Inventor: Herbert Küller, Igelsdorf, Germany

[73] Assignee: Siemens Aktiengesellschaft, Munich, Germany

[22] Filed: Oct. 31, 1974

[21] Appl. No.: 519,677

[30] Foreign Application Priority Data
Nov. 5, 1973   Germany............................ 2355202

[52] U.S. Cl............................. 235/150.2; 114/125; 318/588; 235/183
[51] Int. Cl.².................... G06G 7/18; B63B 39/03
[58] Field of Search.............. 235/150.2, 151.3, 183; 114/121, 122, 125; 318/585, 588

[56] References Cited
UNITED STATES PATENTS

| | | |
|---|---|---|
| 2,901,996 | 9/1959 | Bell................................ 318/588 X |
| 3,322,942 | 5/1967 | Gerard et al....................... 235/183 |
| 3,421,060 | 1/1969 | Irvine.............................. 318/588 X |
| 3,428,788 | 2/1969 | Fisher et al...................... 235/150.2 |
| 3,516,377 | 6/1970 | Field et al........................... 114/125 |
| 3,521,593 | 7/1970 | Pangalila............................. 114/125 |
| 3,604,386 | 9/1971 | Turci.................................. 114/125 |
| 3,847,348 | 11/1974 | Russ............................ 235/150.2 X |

*Primary Examiner*—Edward J. Wise
*Attorney, Agent, or Firm*—Kenyon & Kenyon Reilly Carr & Chapin

[57] ABSTRACT

The measured rolling rate of a ship and a measured liquid level difference in a liquid contained in a stabilizing tank are supplied to frequency dependent members having identical frequency response to obtain a derived roll angle and derived level difference after which a circuit is provided to measure the phase difference between the quantities developed and to develop an output analog voltage representing the difference between a desired relationship between the phases of the two and the actual phase relationship.

10 Claims, 6 Drawing Figures

Fig.1

APPARATUS FOR DETERMINING THE PHASE DIFFERENCE BETWEEN THE ROLLING OSCILLATION OF A SHIP AND A LIQUID CONTAINED IN A STABILIZING TANK

BACKGROUND OF THE INVENTION

This invention relates to stablization systems for damping the rolling oscillations of ships in general and more particularly to improved apparatus for determining the phase difference between the roll oscillation of a ship and the oscillation of a liquid contained in a stablizing tank.

When damping a rolling motion of a ship using a stablizing tank the stablizing effect depends on the amount of liquid contained in the tank. In order to optimize a stablizing effect the tank content must be varied as a function of the frequency of the waves of sea motion striking the ship most frequently. This frequency depends on the depth of water, the direction and intensity of the wind, the distance from land, and the velocity and course of the ship.

There is an optimum stablizing effect when the phase difference between the motion of the liquid in the stabilizing tank and the ship's roll angle is $\pi/2$ [90°]. In one previously developed stabilization device for a ship provisions are made to measure the oscillations of the tank liquid and the oscillations of the ship's roll and to generate signals which selectively actuate, through a control unit, devices for filling and emptying the tank until the phase of the liquid tank oscillation trails by approximately 90°. Such is disclosed in German Auglegeschrift No. 1,919,601. However, means for directly measuring a ship's roll angle turn out to be quite costly in practice. It is much simpler to measure the ship's roll rate using means such as a gyro. The roll angle can then be determined from the measured roll rate through integration. However, in practice, in view of the very low frequencies, typically in the range from 0.02 to 0.2 Hz, of the sea motion, an integration cannot be carried out over a long periods of time because of drift in the real sensors and integrators which will unduly falsify the result. Only ac voltages up to a finite lower frequency limit which is determined by the quality of the integrating amplifier used and the capacity of the integrating capacitor can be intergrated with adequate accuracy. However, for an economical solution the lower frequency of real integrators is so high that at the normal frequencies of sea motion which occur the error is too great.

In view of these problems the need for an improved system for determining correctly the phase difference between the roll oscillation of a ship and the oscillation of a liquid contained in a stabilizing tank without drift of the sensors and amplifiers or integrators being used unduly falsifying the result of the measurements at the very low frequencies of sea motion becomes evident.

SUMMARY OF THE INVENTION

The present invention solves this problem. In accordance with the present invention a first channel for forming, from the measured roll rate, a derived roll angle having a frequency dependent phase shift relative to the true roll angle is provided. The frequency response of the first channel is obtained by a series arrangement of an ideal integrator and a frequency dependent means. A second channel is used to form, from the measured liquid level difference, a derived liquid level difference with the same frequency dependent phase shift as that of the derived roll angle relative to the true roll angle. The frequency response of the second channel corresponds to the frequency response of the frequency dependent member of the first channel. The first and second channel outputs, the derived roll angle and the derived liquid difference respectively, are provided to a comparator circuit which forms an analog measuring voltage which depends on the phase difference between the roll angle and the liquid level difference.

In accordance with the illustrated embodiments of the invention the first channel for forming the roll angle derived from the measured roll angle includes a delay member, preferably a delay member having lead. The second channel for the formation of a derived liquid level difference may be a lead member, preferably a multistage lead member with delay.

In accordance with another feature of the present invention the comparator circuit forming the analog measuring voltage contains two comparators to form, from the derived roll angle and derived liquid difference respectively, binary phase signals corresponding to the respective polarity of their input circuts along with a logic circuit for forming pulses through a gating of the binary phase signals and their inverse. Furthermore an intepretation circuit for forming from the signals so developed an analog measuring voltage depending on the phase difference between the roll angle and the liquid level difference is provided. Particularly well suited for this purpose is a circuit comprising two electronic switches activated by the timing signals output by the logic circuit for alternately connecting a positive and negative reference voltage to a delay member or integrator which forms a measuring voltage independent on the phase difference. A multistage delay member of higher order may be used as this delay member in the interpretation circuit.

DETAILED DESCRIPTION OF THE PREFERRED EMBODIMENT

Figure 1:
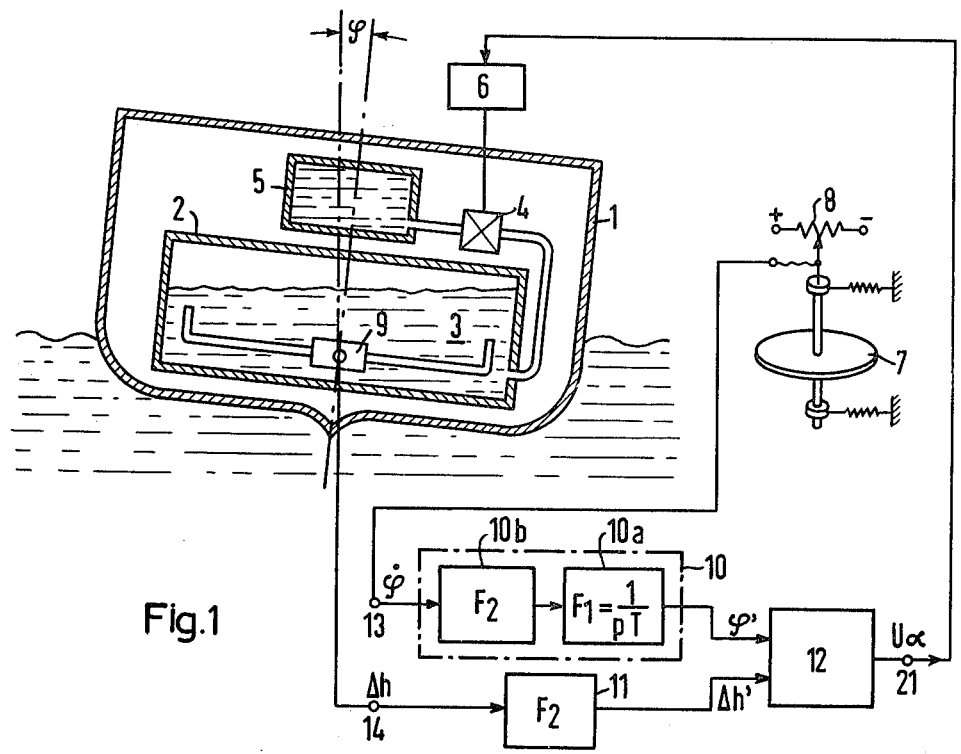
FIG. 1 is a block diagram illustrating a liquid level control system for the stabilizing tank of a ship having a phase measuring arrangement in accordance with the present invention.

FIG. 1 is a block diagram of a stabilization control system according to the present invention. Shown is the hull of a ship 1 having installed therein a long stabilizaton tank 2 extending transversely across the ship's width and partially filled with a liquid 3. The stabilization tank 2 communicates with a spare tank 5 through a pump 4 so that the amount of liquid in the stabilizing tank can be controlled as a function of the frequency of the waves of sea motion. Such control is carried out in response to control commands provided to a command station 6 which controls operation of the pump 4. Clearly such control commands should be such as to obtain an optimum stabilizing effect.

The spring mounted gyro 7 is provided for picking up the roll rate of the ship. This is shown only as an example and other means of measuring rate may equally well be used. In the illustrated embodiment, the shaft of the gyro is coupled to the tap of a potentiometer 8 which is fed by a dc voltage resulting in a voltage proportional to the roll rate being provided from the wiper of the potentiometer 8. Within the stabilization tank 2 a sensor 9 is provided to generate a voltage proportional to the liquid level difference $\Delta h$ therein. This can be for example as illustrated, means for comparing pressures in two pressure tubes. Thus there is provided at the input terminals 13 and 14 the values $\phi$ and $\Delta h$ respectively.

As was outlined above the roll rate $\dot\phi$ cannot simply be integrated to obtain a roll angle $\phi$ because of the low frequencies involved in the drift of the various components. In accordance with the present invention the input $\dot\phi$ at terminal 13 is provided into a first channel 10 comprising the series arrangement of an ideal integrator 10a having a frequency response $$F_1 = 1/pT$$

and a frequency dependent member 10b having a frequency response $F_2$. The frequency response $F_2$ is selected so that the series connection of the ideal integrator 10a and frequency dependent member 10b results in a frequency response which is realizable in a practical sense. In the simplest case this frequency response may be $$F_2 = pt/(1 + pT).$$

Through this arrangement the channel 10 develops from the measured roll rate $\dot\phi$ a derived roll angle $\phi'$ whose phase shift relative to the true roll angle is frequency dependent with the frequency dependent phase shift determined by the frequency dependent member 10b having the frequency response $F_2$. As compared to the frequency response of an ideal integrator, the total frequency response of channel 10 is falsified by the frequency response $F_2$ of the frequency dependent member 10b. In order to be able to compare the phase of the derived roll angle $\phi'$ with the measured liquid level difference $\Delta h$ in the stabilizing tank 2 this measured liquid level difference $\Delta h$ is provided to the terminal 14 of a second channel 11. The second channel 11 has the same frequency response $F_2$ as does the frequency dependent member of the first channel. As a result the derived liquid level difference $\Delta h'$ has the same frequency dependent phase shift relative to the true liquid level difference $\Delta h$ as does the derived roll angle $\phi'$ relative to the true roll angle $\phi$. Since both derived quantities are thus subject to the same frequency dependent phase rotation they can be introduced into a comparator circuit 12 for the formation of the difference of their phases. The comparator circuit 10 is then used to furnish an analog measuring voltage $U\alpha$ which is proportional to the phase difference between the roll angle and the liquid level difference and which is then converted in the command station 6 into a corresponding commands to the pump 4 which is used as the control element.

Figure 2:
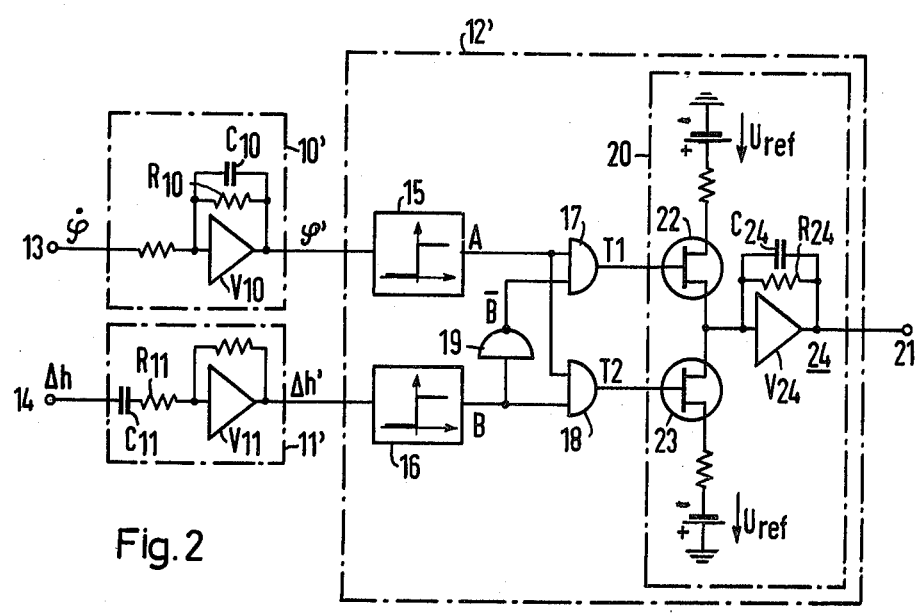
FIG. 2 is a circuit diagram of a phase measuring arrangement according to the present invention.

FIG. 2 illustrates the circuit of one embodiment of the present invention for determining phase difference. The first channel 10' is in the form of a delay member having its input coupled to the terminal 13 at which terminal the roll rate appears. It delivers at its output the derived roll angle $\phi'$. The delay member comprises comprises an operational amplifier $V_{10}$ having a parallel connection of a resistor $R_{10}$ and capacitor $C_{10}$ in its feedback path.

The second channel 11' is designed as a lead member and has as its input the quantity $\Delta h$ appearing at the input terminal 14. It provides at its output the derived liquid level difference $\Delta h'$. The lead member 11' comprises an operational amplifier $V_{11}$ having in its input circuit the series connection of a resistor $R_{11}$ and a capacitor $C_{11}$.

In order for the delay member 10' and the lead member 11' to have the same time response they must have the same time constant T. Thus, the following condition must be met:

$$T = R_{10} \cdot C_{10} = R_{11} \cdot C_{11}.$$

The derived auxiliary quantities $\phi'$ and $\Delta h'$ are shifted relative to the actual quantities $\phi$ and $\Delta h$ by the same frequency dependent phase angle. Thus the phase difference between the derived auxiliary quantities is of the same magnitude as the actual phase difference between the respective actual quantities.

In order to determine this phase difference the derived roll angle $\phi'$ is provided to the input of a comparator 15 and the derived liquid level difference $\phi h'$ to a comparator 16 in the overall comparator circuit 12'. The comparators are arranged to provide output signals A and B which are dependent on the input polarity. For example the comparators can be arranged to put out a pulse at a positive or logic "1" level for an input greater than zero and an output at a zero or logic "0" level for an input less than zero. Thus, a logic "1" or positive signal will appear during the positive half wave and a zero or ground level corresponding to a logic "0" during the negative half wave. An inverter gate 19 is coupled to the output of comparator 16 to form a value $\overline{B}$, the inverse of the output B. These three quantities are then used as inputs to AND gates 17 and 18 to form time signals $T_1$ and $T_2$ in accordance with the following logic equations:

$$T1 = A\ \&\ \overline{B}$$

$$T1 = A\ \&\ B.$$

If the derived roll angle $\phi'$ and the derived liquid level difference $\Delta h'$ are shifted relative to each other by $\pi/2$ the time signals t1 and T2 are each at the logic 1 level exactly every quarter of the measuring period. If the phase difference is not exactly $\pi/2$ then one of the two time signals will last longer than the other. The time difference between the two time signals is proportional to the phase difference $\alpha$ deviating from $\pi/2$. The time difference between the two time signals can be measured in a well known manner either digitally or by analog integration over one oscillation period. However this has a disadvantage in that the oscillation period of the motion of the sea must be determined. However, real sea motion contains a mixture of many different frequencies making a reliable determination of one oscillation period generally impossible. The uncertainties resulting from such a method of determining phase difference may be alleviated by a costly circuit which recognizes a measured value as correct only if it remains unchanged over a specified number of test periods. However in a wild sea it may happen that the values change constantly and that no value measured over a long period of time will be available at all.

These disadvantages are avoided in the interpretation circuit 20 of the present invention. It permits having a usable measured value even in wild seas. The circuit 20 includes two switches 22 and 23 which are preferably electronic switches and more preferably field effect transistors. These switches are controlled by the time signals T1 and T2 output by the gate 17 and 18. The switch 22 has its source coupled through a resistor to a positive power supply $+U_{ref}$ and the switch 23 as its source coupled through a resistor to a negative supply $-U_{ref}$. The drains of the two switches 22 and 23 are coupled to the input of an operational amplifier $V_{24}$ having a resistor $R_{24}$ and a capacitor $C_{24}$ in its feedback path. This arrangement forms a delay member 24. The delay time of the delay member 24 is selected to be of a length corresponding to several periods of wave undulation.

Figure 3A:
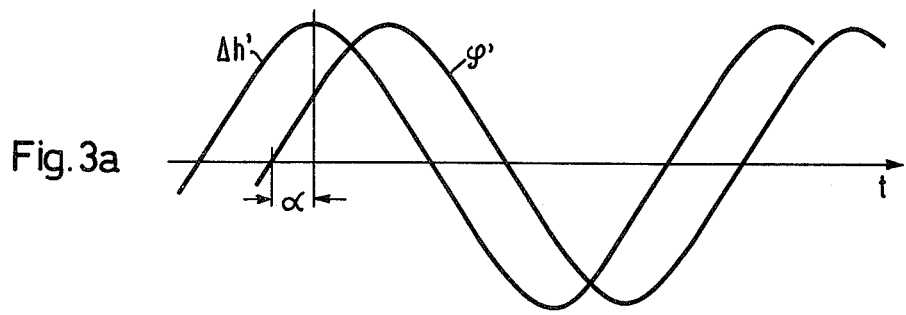
FIGS. 3a, b and c are waveform diagrams helpful in understanding the operation of the circuit of FIG. 2.
Figure 3B:
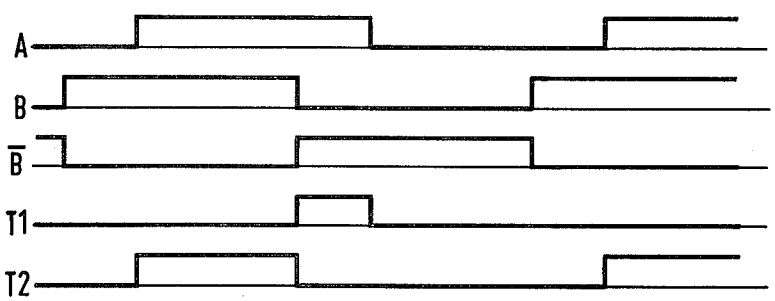
Figure 3C:
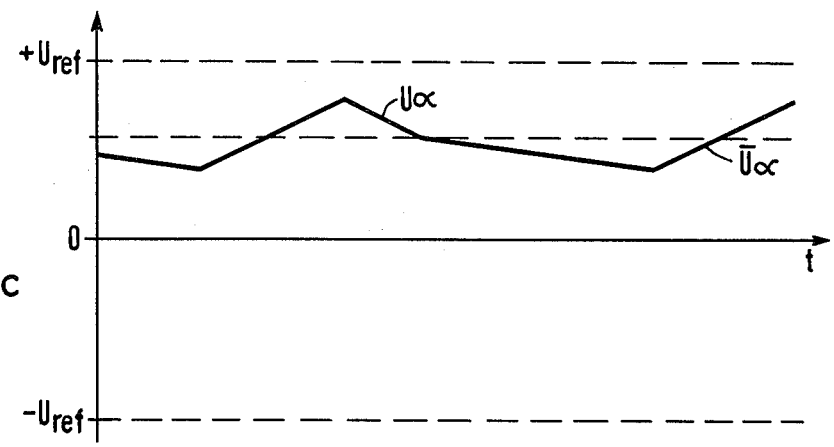

The operating mode of the comparator circuit 12' will now be described with reference to the curves of FIGS. 3a, 3b and 3c. FIG. 3a illustrates the time flow of an oscillation of the derived roll angle $\phi'$ and the derived liquid level difference $\Delta h'$. The derived liquid difference $\Delta h'$ trails the derived roll angle by approximately 60°. As a result there is a phase difference $\alpha$ between the actual amount of phase difference and the desired phase difference of 90°. FIG. 3b illustrates the binary signals A and B which are formed by the comparators 15 and 16 along with the time signals T1 and T2 formed by the logic circuit comprising the gates 17, 18 and 19. During the period when the time signal T2 is present turning on the switch 23 the reference voltage $-U_{ref}$ is applied at the input to the delay member 24 causing the output voltage U$\alpha$ to increase accordingly. When the time signal $T_2$ disappears and the time signal $T_1$ appears instead, the electronic switch 23 is turned off and the switch 22 becomes conductive. At the input of the delay member 24 the positive reference voltage $+U_{ref}$ now appears and the output voltage U$\alpha$ of the delay member decreases accordingly. Because the time signal T2 lasts longer than the time signal T1 in the illustrated example the resulting output voltage U$\alpha$ at the terminal 21 has an overall positive mean value. This positive mean value is a measure of the difference $\alpha$ from the optimal phase shift value $\pi$12 between the roll angle of the ship and the liquid level difference in the stabilizing tank. At a 90° phase difference between $\phi'$ and $\Delta h'$ the switches 22 and 23 are closed for identical periods of time and the mean voltage at the output 21 is zero. If the phase difference between $\phi'$ and $\Delta h'$ deviates from 90° one of the two electronic switches remains closed longer than the other. Then, as illustrated a voltage U$\alpha$ which is proportional to the deviation will appear at the output 21. The sign of the measuring voltage U$\alpha$ indicates whether the phase difference is greater or smaller that 90°.

The advantage of the circuit 20 is than an integration over a defined but difficult to determined time interval is avoided. In effect an integration with sliding integration limits takes place in which there is no longer a need to determine the integration period.

Figure 4:
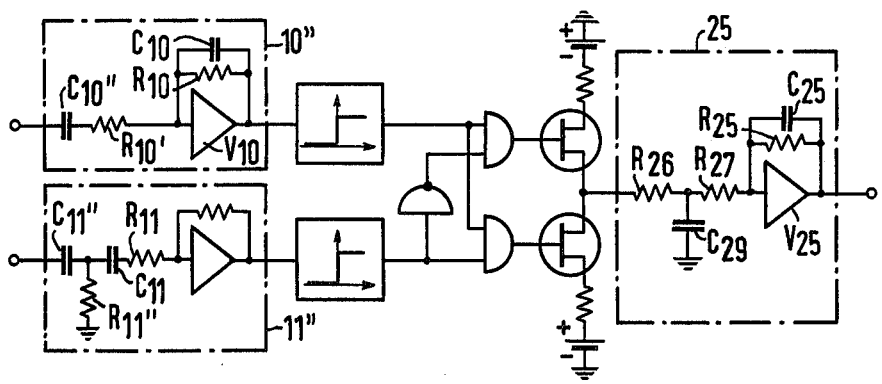
FIG. 4 is a circuit diagram illustrating an example of a phase measuring arrangement according to the present invention using delay members of higher order.

An alternate embodiment of the invention is illustrated on FIG. 4. Basically the circuit is the same as that described above except that the lead members and delay members are of a higher order. The first channel 10'' includes a delay member with lead. In addition to the feedback capacitors $C_{10}$ and resistor $R_{10}$ there is at the input of the amplifier $V_{10}$ a capacitor $C_{10}$ in series with the input resistor $R_{10}'$ the second channel 11'' contains a two stage lead member with delay. Added to the resistor $R_{11}$ and capacitor $C_{11}$ is a further capacitor $C_{11}'$ and a resistor $R_{11}''$ to ground at the junctions of the two capacitors. The interpretation circuit 12 includes a second order delay member 25. This is made up of an amplifier $V_{25}$ with a parallel resistor $R_{25}$ and capacitor $C_{25}$ in its feedback path. At the input to the amplifer $C_{25}$ are a pair of resistors 26 and 27 with a capacitor 29 to ground at their junctions. Through this arrangement a fast response rate is obtained despite a great smoothing effect.

Thus, an improved circuit for determining phase difference between roll angle and the difference in liquid level in a stabilizing tank has been shown. Although specific embodiments have been illustrated and described, it will be obvious to those skilled in the art that various modifications may be made without departing from the spirit of the invention which is intended to be limited solely by the appended claims.

What is claimed is:

1. Apparatus for determining the phase difference between the roll oscillation of a ship and the oscillation of a liquid contained in a stabilizing tank wherein means are provided to obtain an output proportional to the roll rate of the ship and the measured liquid level difference in the stabilizing tank and means provided to adjust the liquid level in the tank in response to a command signal comprising:
    a. first means including the series connection of an ideal integrator and a first frequency dependent member for forming a dervied roll angle, having a frequency dependent phase shift relative to the true angle, from the measured roll rate;
    b. second means comprising a second frequency dependent member having a frequency response corresponding to the frequency response of said first frequency dependent member for forming a derived liquid level difference from the measured liquid level difference having the same frequency dependent phase shift as the derived roll angle relative to the true roll angle;
    c. means for comparing the outputs of said first and seconds means to develop an analog measuring voltage dependent on the phase difference between the roll angle and the liquid level difference, said analog measuring voltage being the control voltage and being provided as a command single input to the means provided to adjust the liquid level in the tank.

2. Apparatus according to claim 1 wherein said first means comprises a delay member.

3. Apparatus according to claim 1 wherein a said first means comprises a delay member with lead.

4. Apparatus according to claim 1 wherein said second means comprises a lead member.

5. Apparatus according to claim 1 wherein a multistage lead member with delay is used as said second means.

6. Apparatus according to claim 1 wherein said comparator circuit comprises:
    a. a first comparator havings its input coupled to the output of said first means and providing a first output signal at one level when its input is positive and at another level when its input is negative;

b. a similar second comparator coupled to the output of said second means providing a second output signal;

c. logic means for the formation of first and second time signals through the logic addition of said first and second output signals and one of said first and second output signals and the inverse of one of said first and second output signals; and d. means for forming from said time signals an analog measuring voltage dependent on the phase difference between the roll angle and liquid level difference.

7. Apparatus according to claim 1 wherein said means for forming said analog measuring voltage comprises:

a. a first electronic switch responsive to said first time signal for switching a positive reference voltage;

b. a second electronic switch responsive to said second time signal for switching a negative reference voltage of the same magnitude;

c. a delay member having its input coupled to said first and second switches, said delay member forming said measuring voltage dependent upon phase difference.

8. Apparatus according to claim 7 wherein said delay member comprises a multi-stage delay member of higher order.

9. Apparatus according to claim 6 wherein said logic means comprises:

a. an inverter coupled to the output of said second comparator;

b. a first AND gate having as inputs the output of said first comparator and the output of said inverter and providing said first time signal at its output;

c. a second AND gate having as inputs the outputs of said first and second comparators and providing said second time signal at its output.

10. Apparatus for determining the phase difference between the roll oscillation of a ship and the oscillation of a liquid contained in a stabilizing tank wherein means are provided to obtain an output proportional to the roll rate of the ship and the measured liquid level difference in the stabilizing tank and means provided to adjust the liquid level in the tank in response to a command signal comprising:

a. first means for forming a derived roll angle, having a frequency dependent phase shift relative to the true angle, from the measured roll rate;

b. second means for forming a derived liquid level difference from the measured liquid level difference having the same frequency dependent phase shift as the derived roll angle relative to the true roll angle;

c. means for comparing the outputs of said first and second means to develop an analog measuring voltage dependent on the phase difference between the roll angle and the liquid level difference, said analog measuring voltage being the control voltage and being provided as a command signal input to the means provided to adjust the liquid level in the tank comprising:

1. a first comparator having its input coupled to the output of said first means and providing a first output signal at one level when its input is positive and at another level when its input is negative;

2. a similar second comparator coupled to the output of said second means providing a second output signal;

3. logic means for the formation of first and second time signals through the logic addition of the said first and second output of said first and second comparator signals and one of said first and second output signals and the inverse of one of said first and second output signals; and 4. means for forming from said time signals an analog measuring voltage dependent on the phase difference between the roll angle and liquid level difference.

* * * * *